(12) United States Patent
Hussain et al.

(10) Patent No.: US 9,515,245 B2
(45) Date of Patent: Dec. 6, 2016

(54) APPARATUS, SYSTEM, AND METHOD FOR ON-CHIP THERMOELECTRICITY GENERATION

(75) Inventors: Muhammad M. Hussain, Austin, TX (US); Hossain M. Fahad, Thuwal (SA); Jhonathan P. Rojas, Thuwal (SA)

(73) Assignee: KING ABDULLAH UNIVERSITY OF SCIENCE AND TECHNOLOGY, Thuwal (SA)

( * ) Notice: Subject to any disclaimer, the term of this patent is extended or adjusted under 35 U.S.C. 154(b) by 3 days.

(21) Appl. No.: 13/185,794

(22) Filed: Jul. 19, 2011

(65) Prior Publication Data

US 2012/0017964 A1 Jan. 26, 2012

Related U.S. Application Data

(60) Provisional application No. 61/367,267, filed on Jul. 23, 2010.

(51) Int. Cl.
*H01L 35/00* (2006.01)
*H01L 35/32* (2006.01)
(Continued)

(52) U.S. Cl.
CPC .............. *H01L 35/32* (2013.01); *H01L 27/16* (2013.01); *H01L 35/34* (2013.01); *H01L 23/38* (2013.01); *H01L 2924/0002* (2013.01)

(58) Field of Classification Search
CPC ....... H01L 35/32; H01L 35/34; H01L 35/30; H01L 35/16; H01L 35/22; H01L 35/18; H01L 35/04; H01L 23/38; H01L 35/00; H01L 27/16; H01L 23/28; H01L 2924/0002
USPC ........................................................ 136/205
See application file for complete search history.

(56) References Cited

U.S. PATENT DOCUMENTS 6,274,803 B1 * 8/2001 Yoshioka et al. ............. 136/201
6,559,538 B1 * 5/2003 Pomerene et al. ............ 257/712
(Continued)

FOREIGN PATENT DOCUMENTS

| EP | 1 840 980 | 10/2007 |
| WO | WO 2008142317 A1 * | 11/2008 |
| WO | WO 2010/010520 | 1/2010 |
| WO | WO 2010010520 A2 * | 1/2010 |

OTHER PUBLICATIONS

PCT International Search Report and Written Opinion issued in International application No. PCT/US2011/044881, dated Dec. 9, 2011.
(Continued)

*Primary Examiner* — Jayne Mershon
*Assistant Examiner* — Mayla Gonzalez Ramos
(74) *Attorney, Agent, or Firm* — Norton Rose Fulbright US LLP

(57) ABSTRACT

An apparatus, system, and method for a thermoelectric generator. In some embodiments, the thermoelectric generator comprises a first thermoelectric region and a second thermoelectric region, where the second thermoelectric region may be coupled to the first thermoelectric region by a first conductor. In some embodiments, a second conductor may be coupled to the first thermoelectric region and a third conductor may be coupled to the second thermoelectric region. In some embodiments, the first conductor may be in a first plane, the first thermoelectric region and the second thermoelectric region may be in a second plane, and the second conductor and the third conductor may be in a third plane.

33 Claims, 6 Drawing Sheets

(51) Int. Cl.
*H01L 35/34* (2006.01)
*H01L 27/16* (2006.01)
*H01L 23/38* (2006.01)

(56) References Cited

U.S. PATENT DOCUMENTS

2003/0041892 A1* 3/2003 Fleurial et al. ............... 136/227
2006/0137732 A1* 6/2006 Farahani et al. .............. 136/201
2010/0144403 A1* 6/2010 Morand ........................ 455/573
2011/0128727 A1* 6/2011 Kochupurackal et al. ... 362/183

OTHER PUBLICATIONS

Strasser et al., "Micromachined CMOS thermoelectric generators as on-chip power supply," *Sensors and Actuators*, 114(2-3):362-370, 2004.

International Preliminary Report on Patenability mailed Jan. 23, 2013 during prosecution of International Application No. PCT/US2011/044881.

* cited by examiner

APPARATUS, SYSTEM, AND METHOD FOR ON-CHIP THERMOELECTRICITY GENERATION

CROSS-REFERENCE TO RELATED APPLICATIONS

This application claims priority to U.S. Provisional Application No. 61/367,267 filed Jul. 23, 2010, the entire contents of which is specifically incorporated herein by reference.

BACKGROUND OF THE INVENTION

Field of the Invention

This invention relates to thermoelectricity generation and more particularly relates to an apparatus system and method for on-chip thermoelectricity generation.

In transistor technology, scaling is a continuous trend which ensures increased performance, typically at the cost of higher power dissipation. This dissipation is usually turned into heat, which may be energy that is lost. Thermoelectric generators, or thermogenerators, convert heat to electricity using a phenomenon called the Seebeck effect after Thomas Johann Seebeck.

SUMMARY OF THE INVENTION

A thermoelectric generator is presented. In some embodiments, the thermoelectric generator comprises a first thermoelectric region and a second thermoelectric region, where the second thermoelectric region may be coupled to the first thermoelectric region by a first conductor. In some embodiments, a second conductor may be coupled to the first thermoelectric region and a third conductor may be coupled to the second thermoelectric region. In some embodiments, the second conductor may be coupled to a first surface of the first thermoelectric region. The first conductor may be coupled to a second surface of the first thermoelectric region. In some embodiments, the first conductor may be coupled to a first surface of the second thermoelectric region. In some embodiments, the third conductor may be coupled to a second surface of the second thermoelectric region.

In some embodiments, the first, second, or third conductor may be a metal, such as copper. In some embodiments, the first, second or third conductor may be conductive material such as polysilicon.

In some embodiments, the first or second thermoelectric region may be a semiconductor. In some embodiments, the first or second thermoelectric region may be Bismuth Telluride. In some embodiments, the first thermoelectric region may be n-doped Bismuth Telluride. In some embodiments, the second thermoelectric region may be p-doped Bismuth Telluride.

In some embodiments, the first conductor may be in a first plane. In some embodiments, the first thermoelectric region and the second thermoelectric region may be in a second plane. The second plane may be more parallel than perpendicular to first plane. In some embodiments, the second plane may be parallel, or substantially parallel, to the first plane. In some embodiments, the second conductor and the third conductor may be in a third plane, where the third plane is more parallel than perpendicular to the first plane. In some embodiments, the third plane may be parallel, or substantially parallel, to the second plane. In some embodiments, the first plane may be adjacent to the second plane and the second plane may be adjacent to the third plane.

In some embodiments, the first conductor may be coupled to the first thermoelectric region on a first surface, where the first surface of the thermoelectric region is between the first plane and the second plane. In some embodiments, the second conductor may be coupled to the first thermoelectric region on a second surface of the first thermoelectric region, where the second surface of the thermoelectric region is between the second plane and the third plane.

In some embodiments, the first conductor may be coupled to the second thermoelectric region on a first surface of the second thermoelectric region, where the first surface of the thermoelectric region is between the first plane and the second plane. In some embodiments, the third conductor may be coupled to the second thermoelectric region on a second surface of the second thermoelectric region, where the second surface of the thermoelectric region is between the second plane and the third plane.

A method for fabricating a thermoelectric generator is also presented. In some embodiments, the method includes forming a first conductor. In some embodiments, the method also includes depositing a first thermoelectric region, where the first thermoelectric region may be coupled to the first conductor. In some embodiments, the method may also include depositing a second thermoelectric region, where the second thermoelectric region may be coupled to the first conductor. In some embodiments, the method may also include depositing a second conductor coupled to the first thermoelectric region and depositing a third conductor coupled to the second thermoelectric region.

In some embodiments, the method may include depositing a first mask layer on a conductor layer. The method may include selectively removing the mask layer. The method may also include etching the conductor from areas where the mask layer was removed.

In some embodiments, the method may include depositing the first thermoelectric region comprises. The method may also include depositing a second mask layer on the first conductor. In some embodiments, the method may include depositing a third mask layer on the second mask layer and/or selectively removing portions of the third mask layer. The method may also include etching the second mask layer, and depositing a first thermoelectric material.

In some embodiments, the method may include depositing a fourth mask layer. In some embodiments, the method may include selectively removing portions of the fourth mask layer, etching the second mask layer, and/or depositing a second thermoelectric material.

In some embodiments the method may include depositing a conductor layer coupled to the first thermoelectric region and the second thermoelectric region, depositing a fifth mask layer, selectively removing the fifth mask layer, and/or etching the conductor layer.

A semiconductor device is also presented. In some embodiments, the semiconductor device may include an integrated circuit, and/or a first thermoelectric region, a second thermoelectric region, where the second thermoelectric region is coupled to the first thermoelectric region by a first conductor. In some embodiments, the semiconductor device may include a second conductor coupled to the first thermoelectric region, and/or a third conductor coupled to the second thermoelectric region, where the first thermoelectric region and the second thermoelectric region are thermally coupled to the integrated circuit.

In some embodiments, the first thermoelectric region and the second thermoelectric region may be configured to provide electrical current to the integrated circuit.

In some embodiments, the first conductor may be in a first plane. The first thermoelectric region and the second thermoelectric region may be in a second plane, where the second plane is more parallel than perpendicular to first plane. In some embodiments, the second plane may be parallel, or substantially parallel, to the first plane. In some embodiments, the second conductor and the third conductor may be in a third plane, where the third plane is more parallel than perpendicular to the first plane. In some embodiments, the third plane may be parallel, or substantially parallel, to the first plane. In some embodiments, the integrated circuit may be in a fourth plane, where the fourth plane is more parallel than perpendicular to the first plane. In some embodiments, the fourth plane is parallel, or substantially parallel, to the first plane. In some embodiments, the fourth plane may be adjacent to the first plane. In some embodiments, the fourth plane may not be adjacent to the third plane.

The term "coupled" is defined as connected, although not necessarily directly, and not necessarily mechanically.

The terms "a" and "an" are defined as one or more unless this disclosure explicitly requires otherwise.

The term "substantially" and its variations are defined as being largely but not necessarily wholly what is specified as understood by one of ordinary skill in the art, and in one non-limiting embodiment "substantially" refers to ranges within 10%, preferably within 5%, more preferably within 1%, and most preferably within 0.5% of what is specified.

The terms "comprise" (and any form of comprise, such as "comprises" and "comprising"), "have" (and any form of have, such as "has" and "having"), "include" (and any form of include, such as "includes" and "including") and "contain" (and any form of contain, such as "contains" and "containing") are open-ended linking verbs. As a result, a method or device that "comprises," "has," "includes" or "contains" one or more steps or elements possesses those one or more steps or elements, but is not limited to possessing only those one or more elements. Likewise, a step of a method or an element of a device that "comprises," "has," "includes" or "contains" one or more features possesses those one or more features, but is not limited to possessing only those one or more features. Furthermore, a device or structure that is configured in a certain way is configured in at least that way, but may also be configured in ways that are not listed.

Other features and associated advantages will become apparent with reference to the following detailed description of specific embodiments in connection with the accompanying drawings.

BRIEF DESCRIPTION OF THE DRAWINGS

The following drawings form part of the present specification and are included to further demonstrate certain aspects of the present invention. The invention may be better understood by reference to one or more of these drawings in combination with the detailed description of specific embodiments presented herein.

DETAILED DESCRIPTION

Various features and advantageous details are explained more fully with reference to the nonlimiting embodiments that are illustrated in the accompanying drawings and detailed in the following description. Descriptions of well known starting materials, processing techniques, components, and equipment are omitted so as not to unnecessarily obscure the invention in detail. It should be understood, however, that the detailed description and the specific examples, while indicating embodiments of the invention, are given by way of illustration only, and not by way of limitation. Various substitutions, modifications, additions, and/or rearrangements within the spirit and/or scope of the underlying inventive concept will become apparent to those skilled in the art from this disclosure.

Figure 1A:
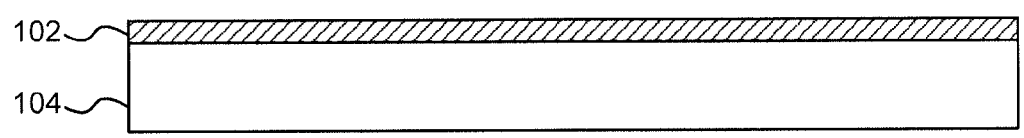
FIGS. 1A-1P are schematic block diagrams illustrating one embodiment of a fabrication flow for making a thermoelectric generator.
Figure 1B:
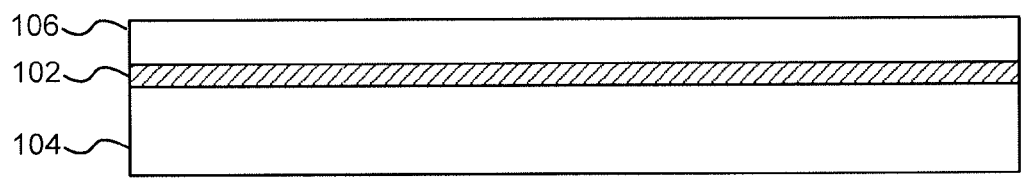
Figure 1C:
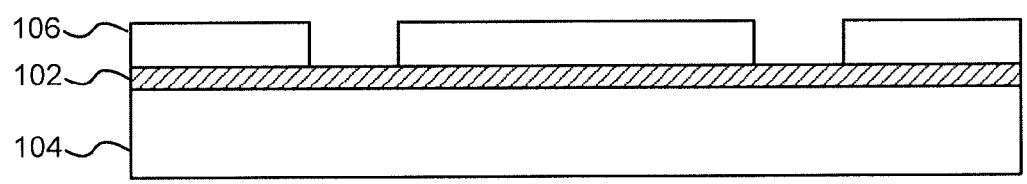
Figure 1D:
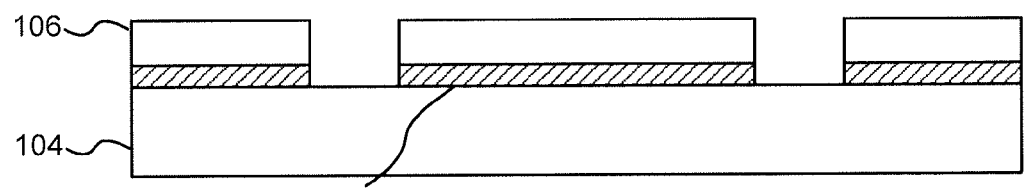
Figure 1E:
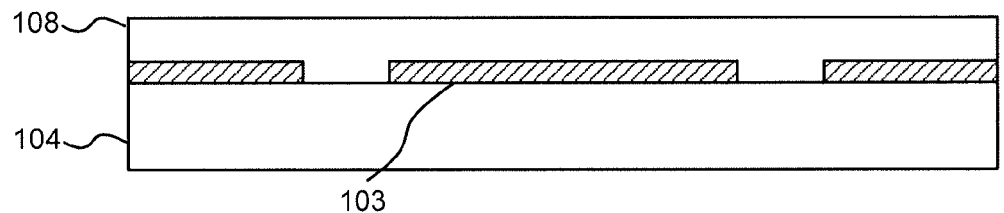
Figure 1F:
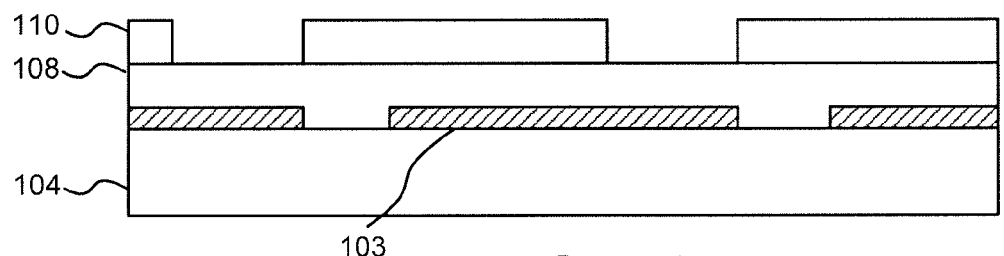
Figure 1G:
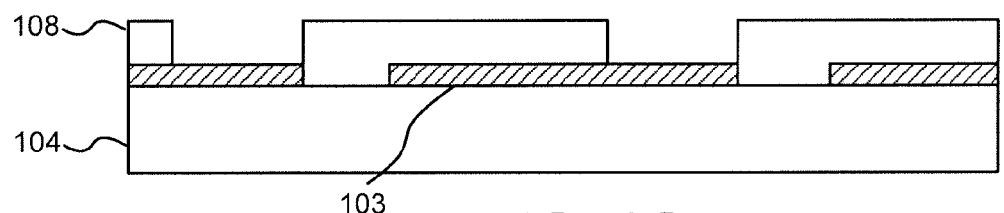
Figure 1H:
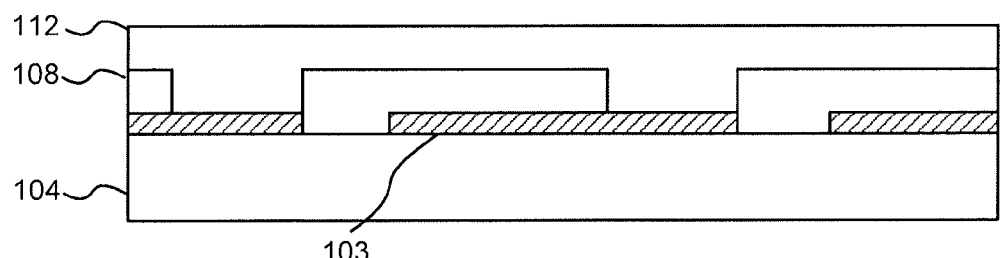
Figure 1I:
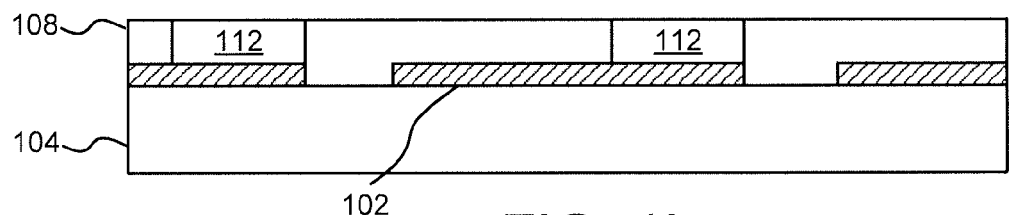
Figure 1J:
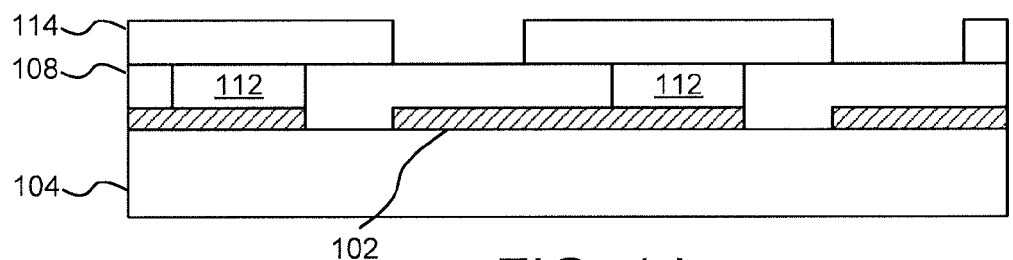
Figure 1K:
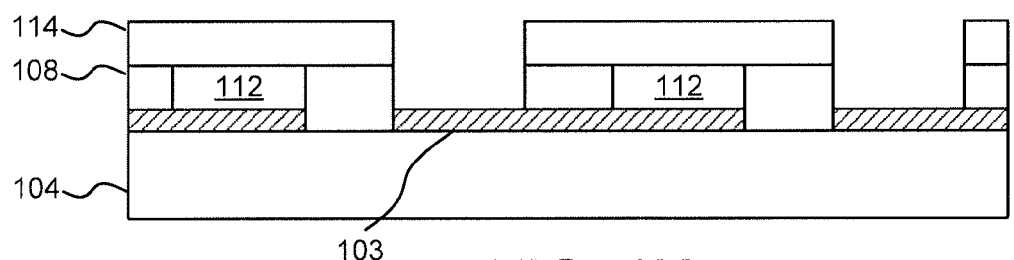
Figure 1L:
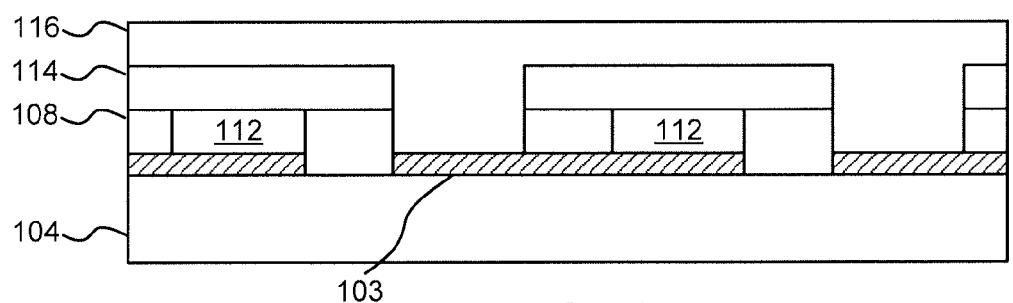
Figure 1M:
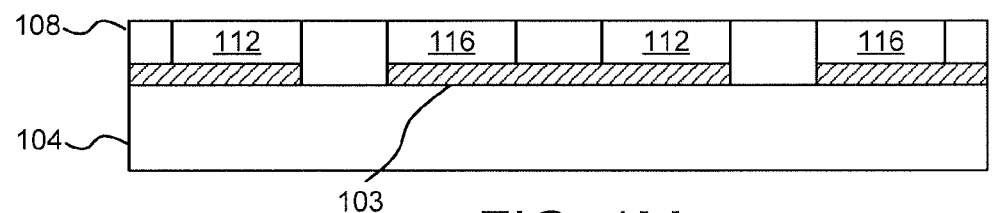
Figure 1N:
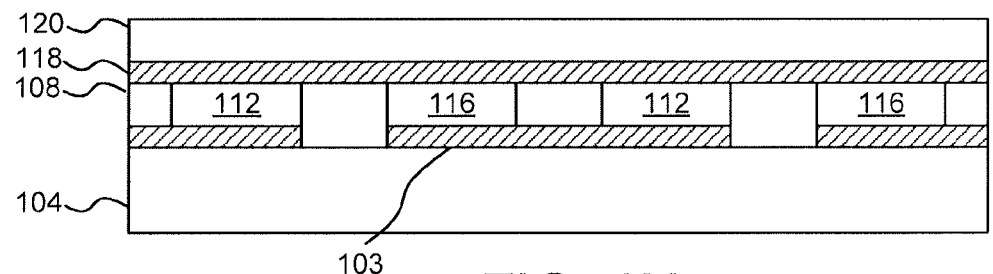
Figure 1O:
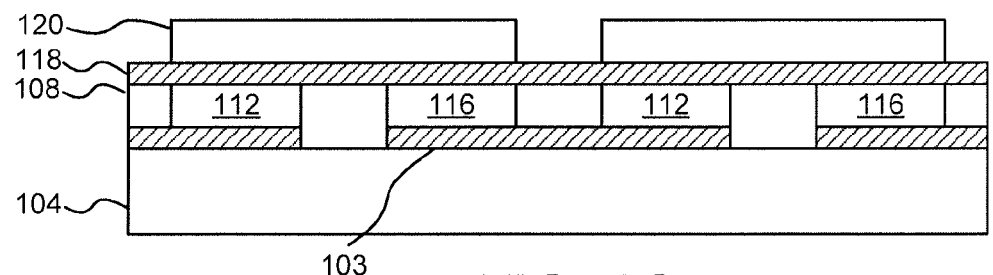
Figure 1P:
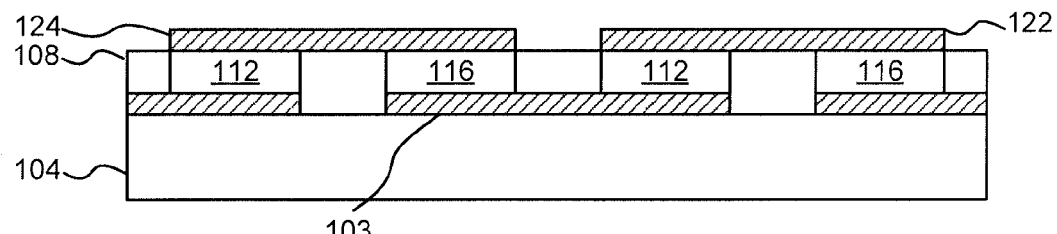

FIGS. 1A-1P illustrate one embodiment of a fabrication flow for a thermoelectric generator. Referring to FIG. 1A, the flow begins with a substrate 104 that may be in the form of a wafer. In some embodiments, the substrate may be silicon or buried oxide silicon. In some embodiments, the substrate may be gallium nitride. On top of the substrate 104 is a first conductor layer 102. In some embodiments the first conductor layer 102 may be copper or it may be polysilicon. The first conductor layer 102 may be deposited using chemical vapor deposition (CVD). After the first conductor layer 102 is deposited, the wafer may be primed in hexamethyldisilazane (HMDS) to promote better adhesion of photoresist. A first mask layer 106 is then deposited on the first conductor layer 102, as shown in FIG. 1B. The first mask layer 106 may be a photoresist layer or other material used in photolithography. After the photoresist is deposited, a prebaking process may be performed and the resist may then be exposed and developed.

FIG. 1C shows additional steps in this flow for making a thermoelectric generator. The first mask layer 106 is etched in some areas. The first mask layer 106 may be etched using a wet etch process. The etching exposes the first conductor layer 102 in some areas.

As shown in FIG. 1D, the first conductor layer 102 may then be etched to create separate segments of a first conductor 103. Although FIG. 1D only shows the etching in 2 dimensions, the separate segments of the first conductor 103 may have different shapes.

FIG. 1E shows additional steps in this flow for making a thermoelectric generator. First the first mask layer 106 is removed and the wafer is cleaned. Second a layer of insulator 108 is deposited on the wafer. In some cases the insulator 108 may be silicon nitride ($Si_3N_4$) and may be deposited using CVD. The layer of insulator 108 may be relatively thick because it creates a well that holds the thermoelectric material. In some cases, a relatively thick layer of thermoelectric material is necessary to efficiently create electrical power.

FIG. 1F shows how a second mask layer 110 is deposited on the insulator 108. The mask layer 110 is patterned so that the insulator 108 is exposed in areas that are laterally adjacent to the areas of the first conductor layer 102 that have been etched.

FIG. 1G shows how the insulator 108 has been etched away in regions where the second mask layer was not present. This etch process exposes the insulator 102 in areas not previously exposed. Additionally, FIG. 1G shows how the second mask layer 110 has been removed.

FIG. 1H shows the first thermoelectric material 112 deposited onto the wafer. In some embodiments, the first thermoelectric material 112 is n-type $Bi_2Te_3$. The first thermoelectric material 112 fills the well left in the insulator 108. FIG. 1I shows how the first thermoelectric material 112 creates two regions that are coupled to the first conductor 103 and separated by the insulator layer 108.

FIG. 1J shows a third mask layer 114 that is deposited onto the first thermoelectric material 112 and the insulator 108. The third mask layer may be a photoresist and is patterned to not cover portions of the insulator 108. The insulator 108 may then be etched to expose the first conductor 103, as shown in FIG. 1K.

FIG. 1L shows how a second thermoelectric material 116 is deposited onto the third mask layer 114 and the exposed portions of the first conductor 103. The second thermoelectric material 116 may be p-type $(Bi,Sb)_2Te_3$. The second thermoelectric material is coupled to the first conductor, but is isolated from the first thermoelectric material 112 by insulator 108.

FIG. 1M shows the wafer after the insulator 108 has been reduced to expose the first thermoelectric material 112. In some embodiments, the insulator may be reduced by a chemical mechanical polishing process. After this process, the first thermoelectric material 112 and the second thermoelectric material 116 are exposed on the top side. Additionally, each region of first thermoelectric material 112 is coupled to an adjacent region of second thermoelectric material 116 by the first conductor 103.

FIG. 1N shows the process of depositing the second conductor layer 118 followed by depositing a fourth mask layer 120. The second conductor layer 118 may be deposited using the same processes as may be used for depositing the first conductor layer 102. The photoresist 120 may then be patterned to expose the second conductor 118 in areas between the first thermoelectric region 112 and the second thermoelectric region 116. The second conductor 118 may then be etched where the fourth mask layer 120 is not present to create the second conductor 122 and the third conductor 124. Finally, the fourth mask layer 120 may be removed, leaving the structure shown in FIG. 1P.

As seen in FIG. 1P, alternating regions of a first thermoelectric region 112 and second thermoelectric region 116 are coupled by the first conductor 103, the second conductor 122, and the third conductor 124. Although this figure only shows four regions (two of a first thermoelectric region 112 and two of a second thermoelectric region 116), this pattern may be repeated many times, which results in several regions being connected in series.

The second conductor 122 is coupled to a second surface of the first thermoelectric region 112, which in FIG. 1P is the top surface of the second thermoelectric region 112. The first conductor 103 is coupled to a first surface of the first thermoelectric region 112, which in FIG. 1P is the bottom surface of the second thermoelectric region 112.

The first conductor 103 is coupled to a first surface of the second thermoelectric region 116, which in FIG. 1P is the bottom surface of the second thermoelectric region 116. The third conductor 124 is coupled to a second surface of the second thermoelectric region 116, which is the top surface of the second thermoelectric region 116.

The first conductor 103, the second conductor 122, and the third conductor 124 may be made out of metal. In some embodiments, the metal may be copper. Alternatively, the conductors may be made out of polysilicon.

The first thermoelectric region 112, and the second thermoelectric region 116 may be a semiconductor, and that semiconductor may be Bismuth Telluride. The first thermoelectric region 112 is n-doped Bismuth Telluride, and the second thermoelectric region is p-doped Bismuth Telluride.

As seen in FIG. 1P, the first conductor 103 is in a first plane. The first thermoelectric regions 112 and the second thermoelectric regions 116 are in a second plane. In this figure, the second plane is adjacent, parallel, and directly above the first plane. In some embodiments, the second plane is more parallel than perpendicular to first plane. The second conductor 122 and the third conductor 124 are in a third plane. In this figure, the third plane is adjacent, parallel, and directly above the second plane. In some embodiments, the third plane is more parallel than perpendicular to the first plane.

The first conductor 103 is coupled to the first thermoelectric region 112 on a first surface, where the first surface of the first thermoelectric region 112 is between the first plane and the second plane. In FIG. 1P, the first surface of the first thermoelectric region 112 is the bottom of the first thermoelectric region 112, which is between the first plane and the second plane.

The second conductor 122 is coupled to the first thermoelectric region 112 on a second surface of the first thermoelectric region 112, where the second surface of the thermoelectric region is between the second plane and the third plane.

The first conductor 103 is coupled to the second thermoelectric region 116 on a first surface of the second thermoelectric region, where the first surface of the thermoelectric region is between the first plane and the second plane.

The third conductor 124 is coupled to the second thermoelectric region 116 on a second surface of the second thermoelectric region 116, where the second surface of the thermoelectric region 116 is between the second plane and the third plane.

Figure 2:
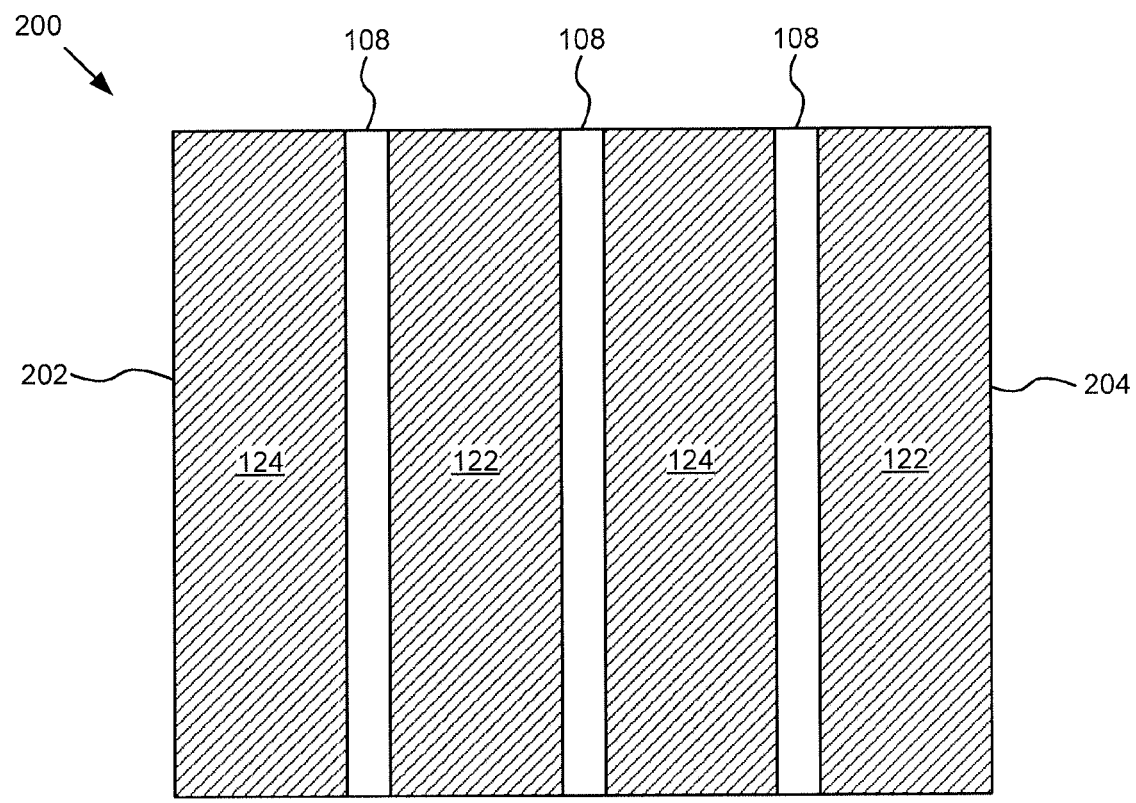
FIG. 2 is a top view of a thermoelectric generator.

FIG. 2 shows a top view of one embodiment of a thermoelectric generator 200. As seen in this figure, there are alternating regions of second conductor 122 and third conductor 124, where the conductors are separated by the insulator 108. Although not shown, there is a first thermoelectric region 112 and second thermoelectric region 116 between each section of second conductor 122 and third conductor 124. Therefore, if an appropriate temperature gradient were applied to the thermoelectric generator 200, one could extract electrical energy by attaching electrical leads to the third conductor 124 labeled as 202 and the second conductor 122 labeled as 204. One advantage of this configuration is that several thermoelectric regions 112 and 118 may be connected in series in a convenient package. The package is fabricated on a wafer, which may be compact and may be precisely manufactured. Additionally, a large number of thermoelectric regions may be fabricated to be configured in series, which may simplify the connections. Only two connections may be necessary for the thermoelectric generator, and both connections may be made on the same side of the wafer. By having both connections on the same side of the wafer, the bottom surface may be able to be more accurately coupled to the heat source. In some embodiments, the thermoelectric generator may also be fabricated on a semiconductor wafer that also contains an integrated circuit. In some embodiments, the thermoelectric generator may be fabricated directly on top of an integrated circuit, which may allow for increased thermal coupling and a decrease in overall size.

Figure 3:
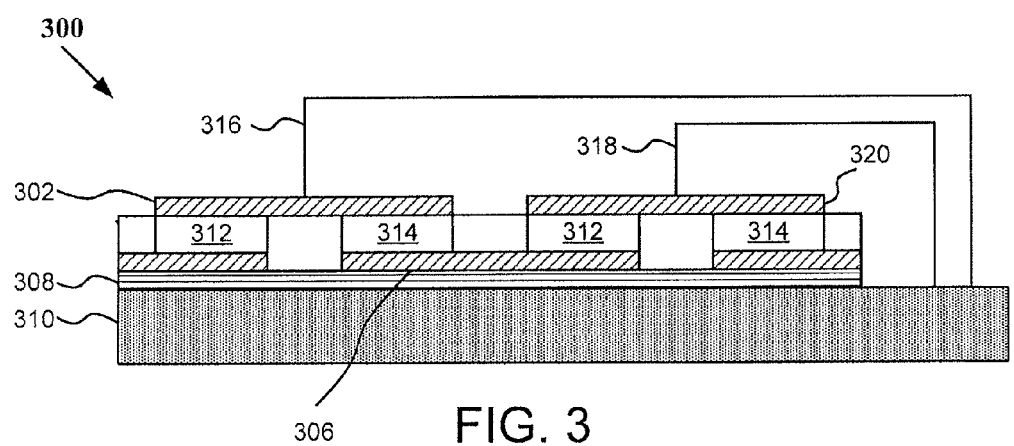
FIG. 3 is a schematic block diagram of a thermoelectric generator coupled to a substrate.

FIG. 3 shows one embodiment of a semiconductor device 300 may use a thermoelectric generator to power the device itself. The device includes a substrate 310, which may be an integrated circuit such as a processor. Processors may produce significant amount of heat, which is typically dissipated using a heat sink and/or a fan. As used herein, the heat can be captured, converted to electrical energy and sent back to the processor or some other circuit.

In some embodiments, the thermoelectric generator is made of a first thermoelectric region 312, a second thermoelectric region 314. In this embodiment, the second thermoelectric region 314 is coupled to the first thermoelectric region 312 by a first conductor 306. A second conductor 320 is coupled to the first thermoelectric region 312, and third conductor 302 is coupled to the second thermoelectric region 314. In this embodiment, the first thermoelectric region 312 and the second thermoelectric region 314 are thermally coupled to the substrate 310. In this embodiment, there is a thermally conductive layer 308 that helps to thermally couple the substrate 310 and the thermoelectric generator. The thermally conductive layer 308 may be thermal grease.

A fourth conductor 318 connects the second conductor 320 to the substrate 310. A fifth conductor 316 connects the third conductor 302 to the substrate. The fourth and fifth conductors 318 and 316 are able to take the electricity generated by the first and second thermoelectric regions 312 and 314 and divert it to the substrate 310. Although not shown, the fourth and fifth conductors 318 and 316 may terminate in a power control module. The power control module may take the output of the thermoelectric generator and put it into a format that is useful for the substrate 310. For example, if the substrate 310 is a processor, the power control module would convert the power generated by the thermoelectric generator to the appropriate voltage and current necessary for the processor. Additionally, the power control module could combine different power sources to provide power to the substrate 310 as supply and demand for power change. For example, when the processor first starts running, it will be cool and not cause much power to be produced in the thermoelectric generator. Therefore, power for the processor would need to originate from another source. As the chip heats up and the thermoelectric generator begins to produce more power, the power control module could use the power from the thermoelectric generator and reduce the amount it draws from other sources.

All of the methods disclosed and claimed herein can be made and executed without undue experimentation in light of the present disclosure. While the apparatus and methods of this invention have been described in terms of preferred embodiments, it will be apparent to those of skill in the art that variations may be applied to the methods and in the steps or in the sequence of steps of the method described herein without departing from the concept, spirit and scope of the invention. In addition, modifications may be made to the disclosed apparatus and components may be eliminated or substituted for the components described herein where the same or similar results would be achieved. All such similar substitutes and modifications apparent to those skilled in the art are deemed to be within the spirit, scope, and concept of the invention as defined by the appended claims.

What is claimed is:

1. A thermoelectric device, comprising:
a first thermoelectric region;
a second thermoelectric region, wherein the first thermoelectric region and the second thermoelectric region are configured to generate electric current when there is a thermal difference between the first thermoelectric region and the second thermoelectric region;
a first conductor having a bottom surface directly abutting a top surface of a substrate, the first conductor coupling the first thermoelectric region to the second thermoelectric region;
a second conductor coupled to the first thermoelectric region;
a third conductor coupled to the second thermoelectric region;
a fourth conductor directly connected to a top surface of the second conductor and a top surface of the substrate, the fourth conductor coupling the second conductor to the substrate; and
a fifth conductor directly connected to a top surface of the third conductor and a top surface of the substrate, the fifth conductor coupling the third conductor to the substrate,
wherein the substrate comprises a heat source, the thermoelectric device being fabricated directly on top of the heat source, and
wherein the second conductor and the third conductor are configured to deliver, via the fourth and fifth conductors, respectively, the generated electric current from the first thermoelectric region and the second thermoelectric region to a power control module.

2. The thermoelectric device of claim 1, where the second and third conductors are coupled to an integrated circuit.

3. The thermoelectric device of claim 2, wherein heat generated during operation of the integrated circuit directly heats at least one of the first thermoelectric region and the second thermoelectric region to create a thermal difference between the first thermoelectric region and the second thermoelectric region and to produce electric current.

4. The thermoelectric device of claim 1, where the first, second and third conductors are metal.

5. The thermoelectric device of claim 4, where at least one of the first, second, and third conductor is copper or another conductive metal.

6. The thermoelectric device of claim 1, where the first thermoelectric region is a semiconductor, the second thermoelectric region is a semiconductor, and wherein the first thermoelectric region and the second thermoelectric region comprise Bismuth Telluride.

7. The thermoelectric device of claim 6, where at least one of the first thermoelectric region and the second thermoelectric region is n-doped.

8. The thermoelectric device of claim 6, where at least one of the first thermoelectric region and the second thermoelectric region is p-doped.

9. The thermoelectric device of claim 1, where:
the first conductor is in a first plane, the first plane defined as a plane parallel to a surface of the first conductor contacting the first thermoelectric region;
the first thermoelectric region and the second thermoelectric region are in a second plane, where the second plane is approximately parallel to the first plane, the second plane defined as a plane parallel to a surface of the first thermoelectric region and the second thermoelectric region contacting the first conductor;
the second conductor and the third conductor are in a third plane, where the third plane is approximately parallel to the first plane, the third plane defined as a plane parallel to a surface of the second conductor contacting the first thermoelectric region.

10. The thermoelectric device of claim 9, where the first plane is adjacent to the second plane and the second plane is adjacent to the third plane.

11. The thermoelectric device of claim 9, where the first conductor is coupled to the first thermoelectric region on a first surface, where the first surface of the thermoelectric region is between the first plane and the second plane.

12. The thermoelectric device of claim 9, where the second conductor is coupled to the first thermoelectric region on a second surface of the first thermoelectric region, where the second surface of the thermoelectric region is between the second plane and the third plane.

13. The thermoelectric device of claim 9, where the first conductor is coupled to the second thermoelectric region on a first surface of the second thermoelectric region, where the first surface of the thermoelectric region is between the first plane and the second plane.

14. The thermoelectric device of claim 9, where the third conductor is coupled to the second thermoelectric region on a second surface of the second thermoelectric region, where the second surface of the thermoelectric region is between the second plane and the third plane.

15. A semiconductor device, comprising:
an integrated circuit;
a first thermoelectric region;
a second thermoelectric region, wherein the second thermoelectric region is coupled to the first thermoelectric region by a first conductor having a bottom surface directly abutting a top surface of a substrate, and wherein the first thermoelectric region and the second thermoelectric region are configured to generate electric current when there is a thermal difference between the first thermoelectric region and the second thermoelectric region;
a second conductor coupled to the first thermoelectric region;
a third conductor coupled to the second thermoelectric region;
a fourth conductor directly connected to a top surface of the second conductor and a top surface of the substrate, the fourth conductor coupling the second conductor to the substrate; and
a fifth conductor directly connected to a top surface of the third conductor and a top surface of the substrate, the fifth conductor coupling the third conductor to the substrate, wherein the substrate comprises a heat source, the thermoelectric device being fabricated directly on top of the heat source,
where the first thermoelectric region and the second thermoelectric region are thermally coupled to the integrated circuit, and
wherein the second conductor and the third conductor are configured to deliver, via the fourth and fifth conductors, respectively, the generated current by the first thermoelectric region and the second thermoelectric region to a power control module.

16. The semiconductor device of claim 15, where the first thermoelectric region and the second thermoelectric region are configured to provide electrical current to the integrated circuit.

17. The semiconductor device of claim 15, where:
the first conductor is in a first plane, the first plane defined as a plane parallel to a surface of the first conductor contacting the first thermoelectric region;
the first thermoelectric region and the second thermoelectric region are in a second plane, where the second plane is approximately parallel to the first plane, the second plane defined as a plane parallel to a surface of the first thermoelectric region and the second thermoelectric region contacting the first conductor;
the second conductor and the third conductor are in a third plane, where the third plane is approximately parallel to the first plane, the third plane defined as a plane parallel to a surface of the second conductor contacting the first thermoelectric region; and
the integrated circuit is in a fourth plane, where the fourth plane is approximately parallel to the first plane, the fourth plane defined as a plane parallel to a surface of the integrated circuit facing the first thermoelectric region.

18. The semiconductor device of claim 17, where the integrated circuit is thermally coupled to the first conductor on the first plane.

19. The semiconductor device of claim 17, where the integrated circuit is thermally coupled to the second conductor on the third plane.

20. The semiconductor device of claim 17, where the fourth plane is adjacent to the first plane.

21. The thermoelectric device of claim 1, the power control module configured to receive power generated by the first thermoelectric region and the second thermoelectric region.

22. The thermoelectric device of claim 21, further comprising an integrated circuit thermally coupled to at least one of the first thermoelectric region and the second thermoelectric region and electrically coupled to the power control module, wherein the power control module is configured to convert power generated by the first thermoelectric region and the second thermoelectric region to a format useful for the integrated circuit.

23. The semiconductor device of claim 15, the power control module configured to receive power generated by the first thermoelectric region and the second thermoelectric region.

24. The semiconductor device of claim 23, wherein the integrated circuit is thermally coupled to at least one of the first thermoelectric region and the second thermoelectric region and electrically coupled to the power control module, wherein the power control module is configured to convert power generated by the first thermoelectric region and the second thermoelectric region to a format useful for the integrated circuit.

25. The thermoelectric device of claim 1, wherein the power control module is configured to combine a plurality of power sources to provide power to the substrate.

26. The thermoelectric device of claim 25, wherein the plurality of power sources comprise at least one power source that provides power to the power control device when the output of the first and second thermoelectric regions is below a power threshold.

27. The thermoelectric device of claim 15, wherein the power control module is configured to combine a plurality of power sources to provide power to the substrate.

28. The thermoelectric device of claim 27, wherein the plurality of power sources comprise at least one power source that provides power to the power control device when the output of the first and second thermoelectric regions is below a power threshold.

29. The thermoelectric device of claim 1, where the first thermoelectric region is a semiconductor, the second thermoelectric region is a semiconductor, and wherein the first thermoelectric region and the second thermoelectric region comprise Antimony Telluride.

30. The thermoelectric device of claim 1, further comprising a thermal conductive layer deposited between the bottom layer of the first conductor and the substrate.

31. The thermoelectric device of claim 15, further comprising a thermal conductive layer deposited between the bottom layer of the first conductor and the substrate.

32. The thermoelectric device of claim 2, where the integrated circuit is fabricated on the substrate.

33. The thermoelectric device of claim 15, where the integrated circuit is fabricated on the substrate.

* * * * *